United States Patent
Soh et al.

(10) Patent No.: US 11,569,473 B2
(45) Date of Patent: Jan. 31, 2023

(54) DISPLAY MODULE AND FOLDABLE DISPLAY DEVICE INCLUDING IHE SAME

(71) Applicant: Samsung Display Co., LTD., Yongin-si (KR)

(72) Inventors: Yong Kwon Soh, Hwaseong-si (KR); In Soo Park, Hwaseong-si (KR); Jin Yong Sim, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 142 days.

(21) Appl. No.: 17/103,178

(22) Filed: Nov. 24, 2020

(65) Prior Publication Data
US 2021/0210715 A1    Jul. 8, 2021

(30) Foreign Application Priority Data

Jan. 8, 2020 (KR) .......................... 10-2020-0002570

(51) Int. Cl.
*H01L 51/52* (2006.01)
*H01L 27/32* (2006.01)

(52) U.S. Cl.
CPC ...... *H01L 51/5237* (2013.01); *H01L 27/3244* (2013.01); *H01L 2251/5338* (2013.01)

(58) Field of Classification Search
CPC ............ H01L 51/5237; H01L 27/3244; H01L 2251/5338
USPC .......................................................... 257/40
See application file for complete search history.

(56) References Cited

U.S. PATENT DOCUMENTS

2019/0302850 A1* 10/2019 Park .................... H04M 1/0216

\* cited by examiner

*Primary Examiner* — Xia L Cross
(74) *Attorney, Agent, or Firm* — Kile Park Reed & Houtteman PLLC

(57) ABSTRACT

A display module includes a panel part, a first supporting member, a second supporting member, a shielding member, and a stretchable member. The panel part includes a pixel array to display an image. The first supporting member is disposed under the panel part. The second supporting member is disposed under the panel part and adjacent to the first supporting member in a first direction. The shielding member covers a boundary area between the first supporting member and the second supporting member. The stretchable member is extended to the shielding member and disposed under the first supporting member or the second supporting member. An elongation of the stretchable member is greater than an elongation of the shielding member.

21 Claims, 13 Drawing Sheets

DISPLAY MODULE AND FOLDABLE DISPLAY DEVICE INCLUDING THE SAME

CROSS-REFERENCE TO RELATED APPLICATION(S)

This application claims priority to and benefits of Korean Patent Application No. 10-2020-0002570 under 35 U.S.C. § 119, filed in the Korean Intellectual Property Office on Jan. 8, 2020, the entire contents of which are incorporated herein by reference.

BACKGROUND

1. Technical Field

Embodiments relate to a display module and a foldable display device including the display module.

2. Description of the Related Art

A display device provides information to users by displaying an image. Flexible display devices which may be transformed to have various shapes are being developed. A flexible display device may be folded, bent or rolled like a piece of paper. A flexible display device may be easily carried and may increase convenience for users.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display module having an impurity-blocking structure.

Embodiments may provide a foldable display device including a display module to improve reliability.

According to an embodiment, a display module may include a panel part, a first supporting member, a second supporting member, a shielding member, and a stretchable member. The panel part may include a pixel array to display an image. The first supporting member may be disposed under the panel part. The second supporting member may be disposed under the panel part and adjacent to the first supporting member in a first direction. The shielding member may cover a boundary area between the first supporting member and the second supporting member. The stretchable member may be extended to the shielding member and disposed under the first supporting member or the second supporting member. An elongation of the stretchable member may be greater than an elongation of the shielding member.

In an embodiment, the display module may further include a hinge part extended to the first supporting member and the second supporting member. The first supporting member and the second supporting member may rotate with respect to a rotation axis of the hinge part.

In an embodiment, the shielding member may include a fabric material including at least one of a woven fabric and a non-woven fabric.

In an embodiment, the shielding member may include a polymeric film.

In an embodiment, the stretchable member may include a knit fabric.

In an embodiment, the stretchable member may include a material including at least one of polyurethane, synthetic rubber, and natural rubber.

In an embodiment, the elongation of the stretchable member may be at least about 10%.

In an embodiment, a first end of the shielding member may be combined with the first supporting member, a second end of the shielding member may be combined with a first end of the stretchable member, and a second end of the stretchable member may be combined with the second supporting member.

In an embodiment, the stretchable member may include a first stretchable member combined with the first supporting member and a second stretchable member combined with the second supporting member. A first end of the shielding member may be extended to the first stretchable member, and a second end of the shielding member may be extended to the second stretchable member.

In an embodiment, the stretchable member may be extended to the shielding member in serial with respect to a tensile force generated by rotation of the first supporting member or the second supporting member.

In an embodiment, a width of the stretchable member in a direction perpendicular to the tensile force may be smaller than a width of the shielding member.

In an embodiment, the display module may further include an impact-absorbing member disposed between the panel part and the first and second supporting members.

In an embodiment, the panel part may include an organic light-emitting display panel.

According to an embodiment, a foldable display device may include a panel part, a first supporting member, a second supporting member, a shielding member, a stretchable member, and a hinge part. The panel part may include a pixel array to display an image. The first supporting member may be disposed under the panel part. The second supporting member may be disposed under the panel part and adjacent to the first supporting member in a first direction. The shielding member may cover a boundary area between the first supporting member and the second supporting member. The stretchable member may be extended to the shielding member and disposed under the first supporting member or the second supporting member. An elongation of the stretchable member may be greater than an elongation of the shielding member. The hinge part may be disposed under the shielding member.

In an embodiment, the hinge part may include a first connection member combined with the first supporting member, a second connection member combined with the second supporting member, a first rotation-sliding member combined with the first connection member and including a sliding surface having an arc shape, a second rotation-sliding member combined with the second connection member and including a sliding surface having an arc shape, a hinge frame including a guiding surface facing the sliding surfaces of the first and second rotation-sliding members, and a hinge cover covering the hinge frame.

In an embodiment, a portion of the stretchable member may be disposed between the second supporting member and the second connection member.

In an embodiment, the shielding member may include an opening through which the hinge part is extended to the first and second supporting members.

In an embodiment, the shielding member may include a material including at least one of a woven fabric, a non-woven fabric, and a polymeric film.

In an embodiment, the stretchable member may include a material including at least one of a knit fabric, polyurethane, synthetic rubber, and natural rubber.

In an embodiment, an end of the shielding member may be combined with the first connection member, and an end of the stretchable member may be combined with the second connection member.

In an embodiment, the panel part may include an organic light-emitting display panel.

According to embodiments, a display module and a display device may include a shielding member to block impurities entering a panel part from a hinge part. The shielding member, to which abrasion may be applied when a display device may be folded or unfolded, may include a highly durable material. A stretchable member including a stretchable material may be extended to the shielding member to allow sliding of the shielding member. Thus, damage to the shielding member or functional deterioration of an impurity-blocking structure including the shielding member may be prevented.

BRIEF DESCRIPTION OF THE DRAWINGS

Aspects of one or more embodiments of the inventive concept will be more clearly understood from the following detailed description taken in conjunction with the accompanying drawings.

DETAILED DESCRIPTION OF THE EMBODIMENTS

A display device according to embodiments of the inventive concept will be described hereinafter with reference to the accompanying drawings, in which some embodiments are shown.

As used herein, the singular forms "a," "an" and "the" are intended to include the plural forms as well, unless the context clearly indicates otherwise.

When an element is described as being disposed "on" another element, it may be directly or indirectly disposed on the other element. For example, intervening elements may be present.

The phrase "at least one of" is intended to include the meaning of "at least one selected from the group of" for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

The term "overlap" may include layer, stack, face or facing, extending over, extending under, covering or partly covering or any other suitable term as would be appreciated and understood by those of ordinary skill in the art.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
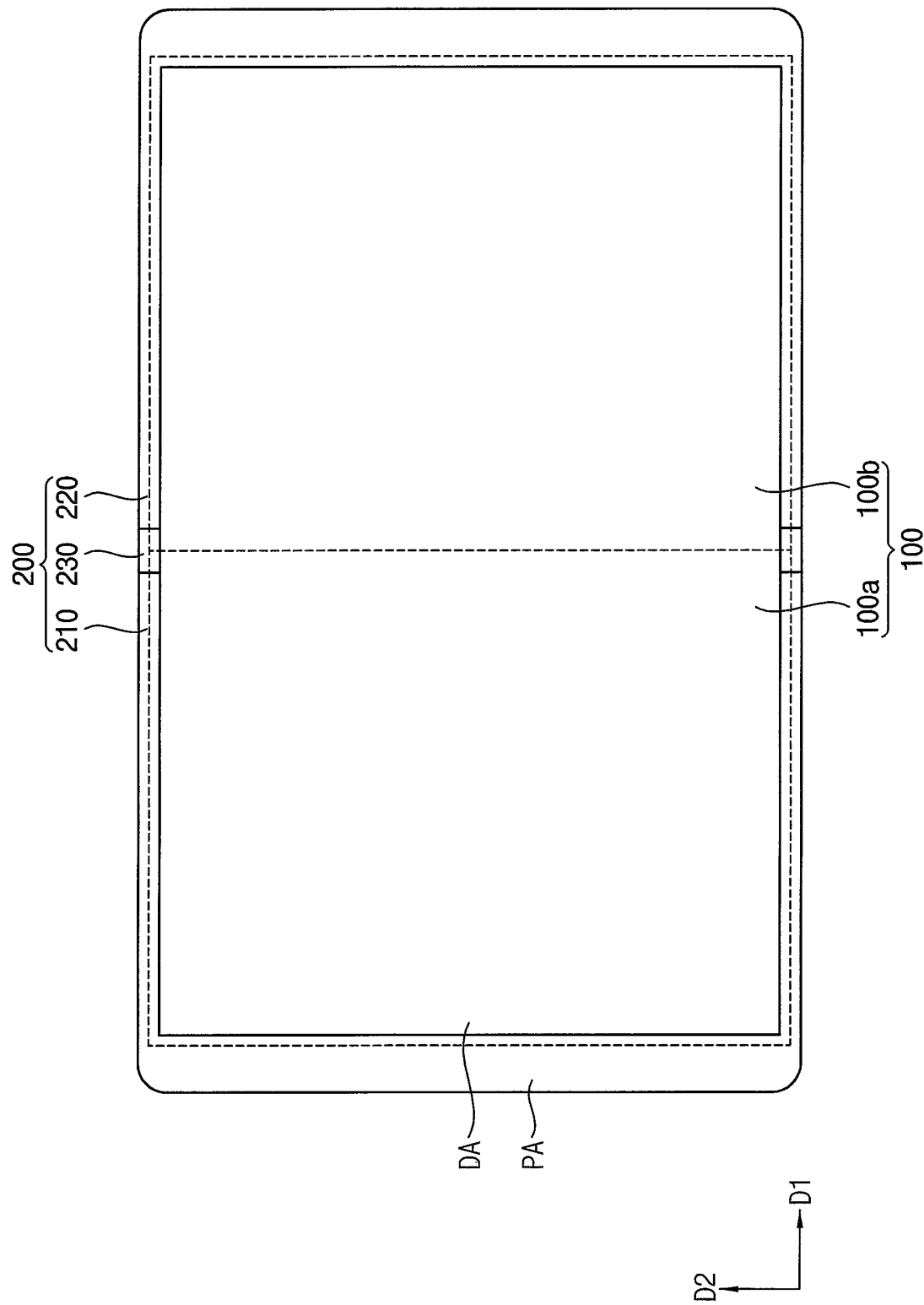
FIG. 1 is a schematic plan view illustrating a foldable display device according to an embodiment.
Figure 2:
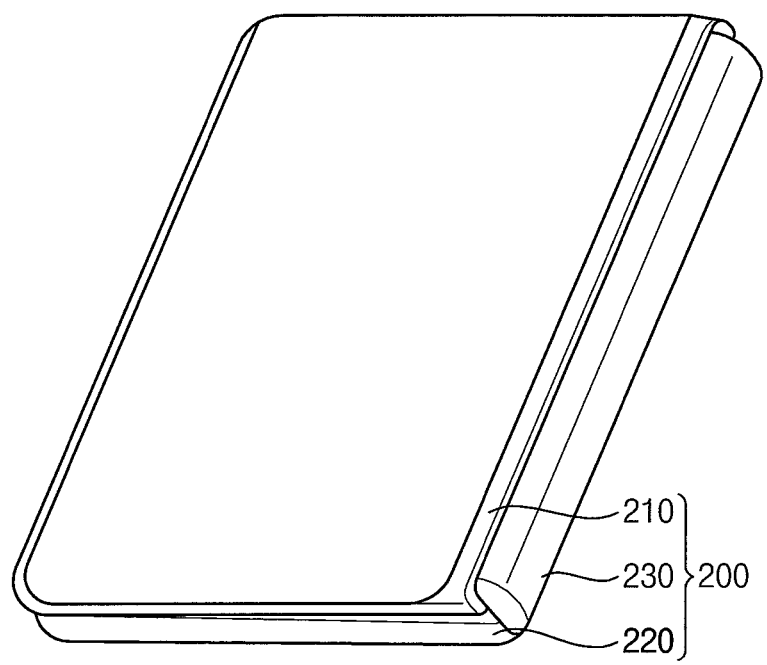
FIG. 2 is a schematic perspective view illustrating a foldable display device according to an embodiment.

FIG. 1 is a schematic plan view illustrating a foldable display device according to an embodiment. FIG. 2 is a schematic perspective view illustrating a foldable display device according to an embodiment. FIG. 1 illustrates a foldable display device, which is unfolded, and FIG. 2 illustrates a foldable display device, which is folded.

A foldable display device according to an embodiment may include a display module 100 and a cover module 200. In the display device, an area, which may display an image, may be defined as a display area DA, and an area, which may not display an image and may be adjacent to the display area DA, may be defined as a peripheral area PA.

The display module 100 may include a screen to display an image. The display module 100 may include a pixel array emitting a light through the screen. For example, the pixel array may generate a light or may adjust a transmittance of a light provided from an external light source, to display an image.

In an embodiment, the display module 100 may include a flexible display panel that may be bent or folded by, for example, an external force. For example, the display module 100 may include an organic light-emitting display panel.

The cover module 200 may be combined with the display module 100. The cover module 200 may receive the display module 100. The cover module 200 may cover at least a lower surface of the display module 100. For example, the cover module 200 may include a first cover portion 210, which may be combined with a first region 100a of the display module, and a second cover portion 220, which may be combined with a second region 100b of the display module 100. The cover module 200 may further cover a side surface and/or a portion of an upper surface of the display module 100.

The first cover portion 210 may be adjacent to the second cover portion 220 in a first direction D1. The first cover portion 210 and the second cover portion 220 may be combined with a hinge part 230 to be rotatable around the hinge part 230. The first cover portion 210 and the second cover portion 220 may be capable of rotating around a rotation axis of the hinge part 230. Thus, the display device may be bent or folded. For example, the hinge part 230 and the rotation axis may extend in a second direction D2 crossing the first direction D1.

Figure 3:
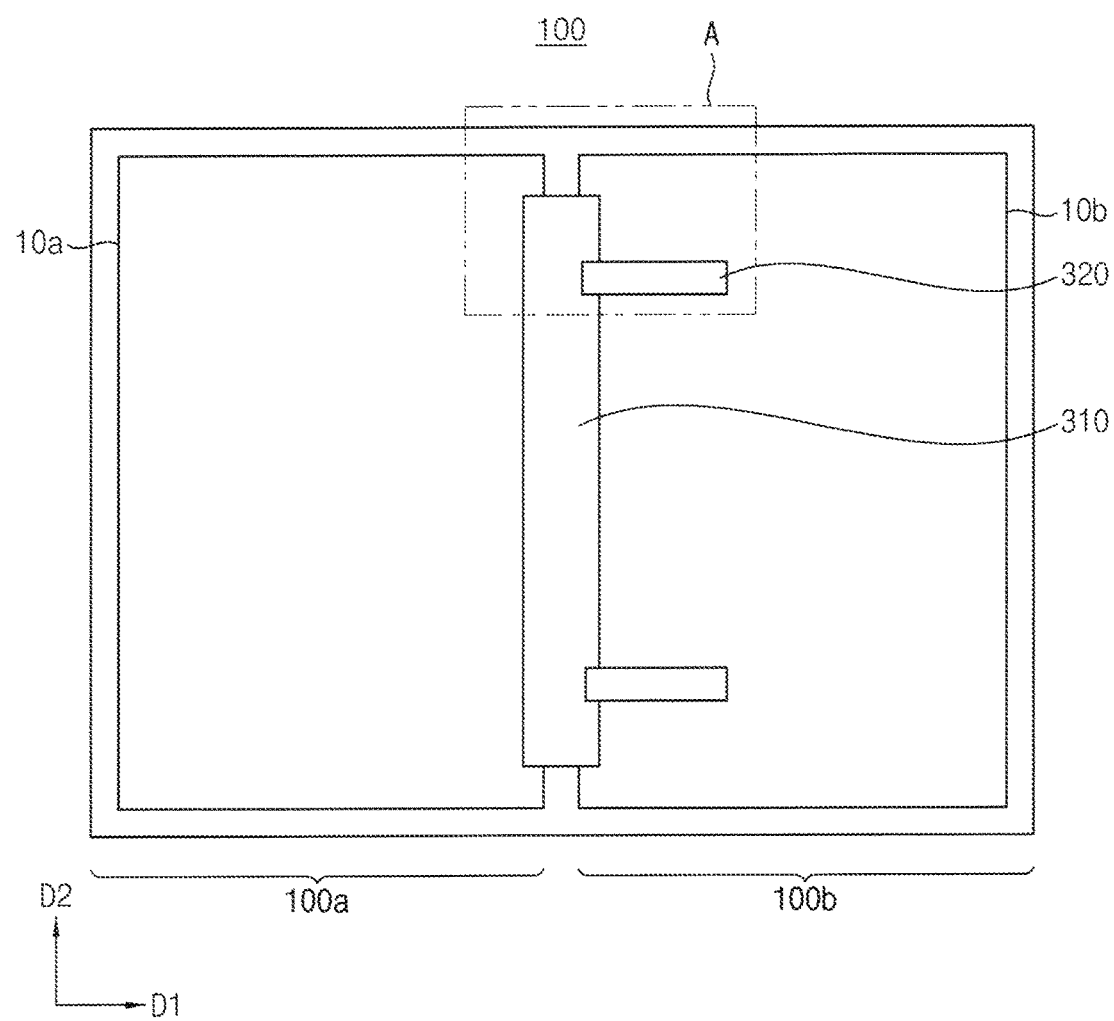
FIG. 3 is a schematic bottom view illustrating a display module according to an embodiment.
Figure 4:
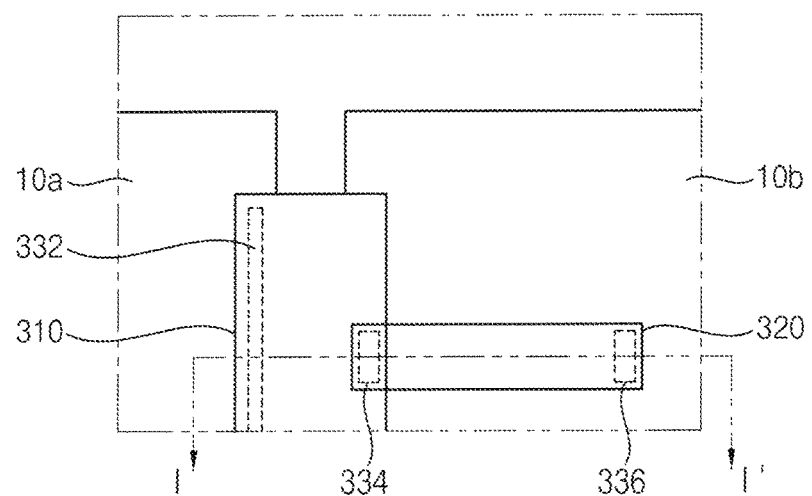
FIG. 4 is an enlarged schematic bottom view illustrating region 'A' of FIG. 3.
Figure 5:
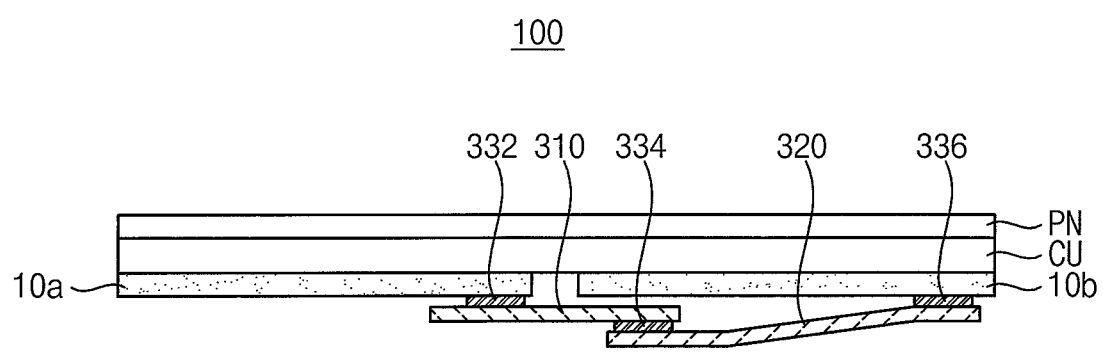
FIG. 5 is a schematic cross-sectional view taken along line I-I' of FIG. 4.

FIG. 3 is a schematic bottom view illustrating a display module according to an embodiment. FIG. 4 is an enlarged schematic bottom view illustrating region 'A' of FIG. 3. FIG. 5 is a schematic cross-sectional view taken along line I-I' of FIG. 4.

Referring to FIGS. 3 to 5, a display module 100 may include a panel part PN. In an embodiment, the panel part PN may include an organic light-emitting display panel.

A supporting member may be disposed under the panel part PN. For example, the display module 100 may include a first supporting member 10a disposed in the first region 100a and a second supporting member 10b disposed in the second region 100b.

The first supporting member 10a may be adjacent to the second supporting member 10b along the first direction D1. For example, the first supporting member 10a may be spaced apart from the second supporting member 10b. However, embodiments are not limited thereto. For example, when the display module 100 may be unfolded, the first supporting member 10a and the second supporting member 10b may substantially contact each other.

The first and second supporting members 10a and 10b may include a rigid material to support the panel part PN. For example, the first and second supporting members 10a and 10b may include a metal, a polymeric material or a combination thereof.

The display module 100 may further include an impact-absorbing member CU. For example, the impact-absorbing member CU may be disposed between the panel part PN and the supporting members 10a and 10b.

For example, the impact-absorbing member CU may have a porous structure. The impact-absorbing member CU having a porous structure may absorb an impact applied to the display module 100 from an exterior to protect the panel part PN. Furthermore, the impact-absorbing member CU may block impurities entering the panel part PN.

For example, the impact-absorbing member CU may include a foam body formed from a polymeric material. For example, the impact-absorbing member CU may include a foam body formed from acrylonitrile butadiene styrene copolymer (ABS), polyurethane (PU), polyethylene (PE), ethylene vinyl acetate (EVA), polyvinyl chloride (PVC) or a combination thereof.

In another embodiment, the impact-absorbing member CU may be omitted or may be partially disposed between the panel part PN and the supporting members 10a and 10b.

In an embodiment, the display module 100 may include a shielding member 310 and a stretchable member 320 extended to the shielding member 310. The shielding member 310 may cover a boundary area between the first region 100a and the second region 100b to block impurities entering the display module 100 from an area under the shielding member 310.

In an embodiment, the shielding member 310 may be disposed on a lower surface of (e.g., under) the first and second supporting members 10a and 10b, and may be combined with the first supporting member 10a. The stretchable member 320 may be disposed on the lower surface of the second supporting member 10b and may be combined with the second supporting member 10b.

In an embodiment, a first end of the shielding member 310 may be combined with the first supporting member 10a, and a second end of the shielding member 310 may be combined with a first end of the stretchable member 320. A second end of the stretchable member 320 may be combined with the second supporting member 10b. For example, the shield member 310 may be combined with the first supporting member 10a by a first adhesive member 332. The shielding member 310 may be combined with the stretchable member 320 by a second adhesive member 334. The stretchable member 320 may be combined with the second supporting member 10b by a third adhesive member 336. For example, the first adhesive member 332 may have a shape extending in the second direction D2.

In an embodiment, the shielding member 310 may not be directly combined with the second supporting member 10b, and may be indirectly combined with the second supporting member 10b through the stretchable member 320 having stretchability. Thus, the stretchable member 320 may be extended to the shielding member 310 in serial with respect to a tensile force applied to the shielding member 310 by rotation of the first supporting member 10a or the second supporting member 10b. Thus, an end of the shielding member 310 disposed under the second supporting member 10b may function as a free end, which may slide on the second supporting member 10b, when the display module 100 may be folded or bent.

In an embodiment, the shielding member 310 may include a highly durable material. Thus, when the display module 100 may be folded or bent, even if abrasion may be caused between the shielding member 310 and corners of the first and second supporting members 10a and 10b, damage to the shielding member 310 may be prevented or reduced.

For example, the highly durable material may have a relatively great abrasion resistance and a relatively small elongation. For example, the highly durable material may have an elongation equal to or less than about 5%. Furthermore, the highly durable material may have enough flexibility to be bendable or foldable in response to transformation of the display device.

For example, the shielding member 310 may include a fabric material such as a woven fabric, a non-woven fabric or the like. The above fabric material may have a relatively great abrasion resistance, and a relatively great flexibility. Thus, when the display module 100 may be folded or bent, the shielding member 310 including the fabric material may get close to the first and second supporting members 10a and 10b. Thus, an underneath area required for bending the display module 100 may be reduced, and impurities entering the display module 100 may be effectively blocked. For example, fibers forming the fabric material may include polyamide such as nylon, polycarbonate, polyketone, polyethylene terephthalate, polymethylmethacrylate or a combination thereof.

In another embodiment, the shielding member 310 may include a polymeric film. For example, the polymeric film may include a material having a relatively great abrasion resistance such as polycarbonate, polyketone, polyethylene terephthalate or a combination thereof. Furthermore, the polymeric film may be coated by an abrasion resistive material such as polytetrafluoroethylene (PTFE), perfluoropolyether, fluorine-containing silicon resin, or the like or a combination thereof.

In an embodiment, the stretchable member 320 may include a stretchable material. For example, the stretchable member 320 may include a fabric material having a knit structure. The fabric material having a knit structure may have a relatively great stretchability suitable for an impurity-blocking structure and may have a relatively great durability. For example, fibers forming the knit structure may include polyamide such as nylon, polyethylene terephthalate, polyolefin, polyurethane or a combination thereof.

In another embodiment, the stretchable member 320 may include a stretchable film. The stretchable film may include a stretchable material such as polyurethane, synthetic rubber, natural rubber, or the like or a combination thereof.

For example, an elongation, which may be a maximum elongation by a yield point, of the stretchable member 320 may be at least about 10%, and may be at least about 40%.

Referring to FIGS. 3 and 4, a width of the stretchable member 320 in a direction perpendicular to a tensile force may be smaller than a width of the shielding member 310. However, embodiments are not limited thereto. The stretchable member 320 may have various designs and dimensions depending on a required strain and disposition of the shielding member 310.

Figure 6:
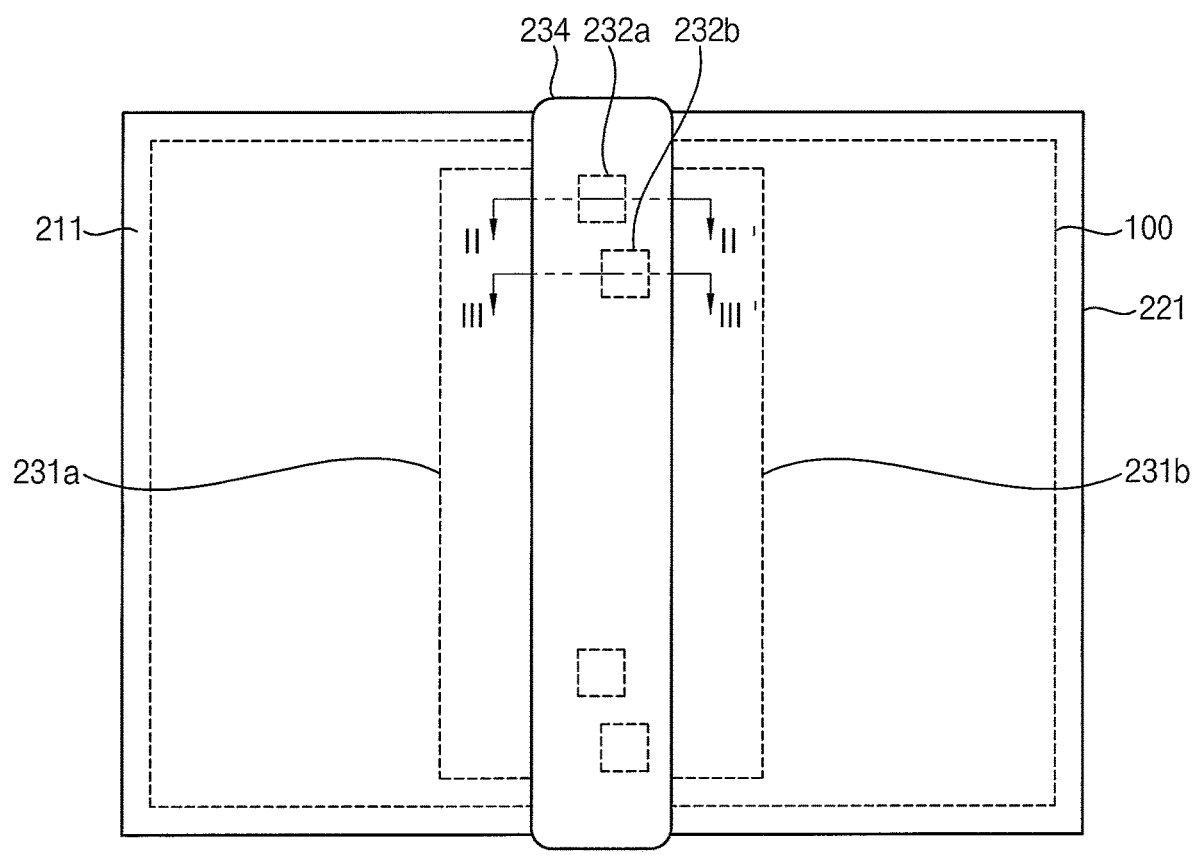
FIG. 6 is a schematic bottom view illustrating a display module according to an embodiment.
Figure 7:
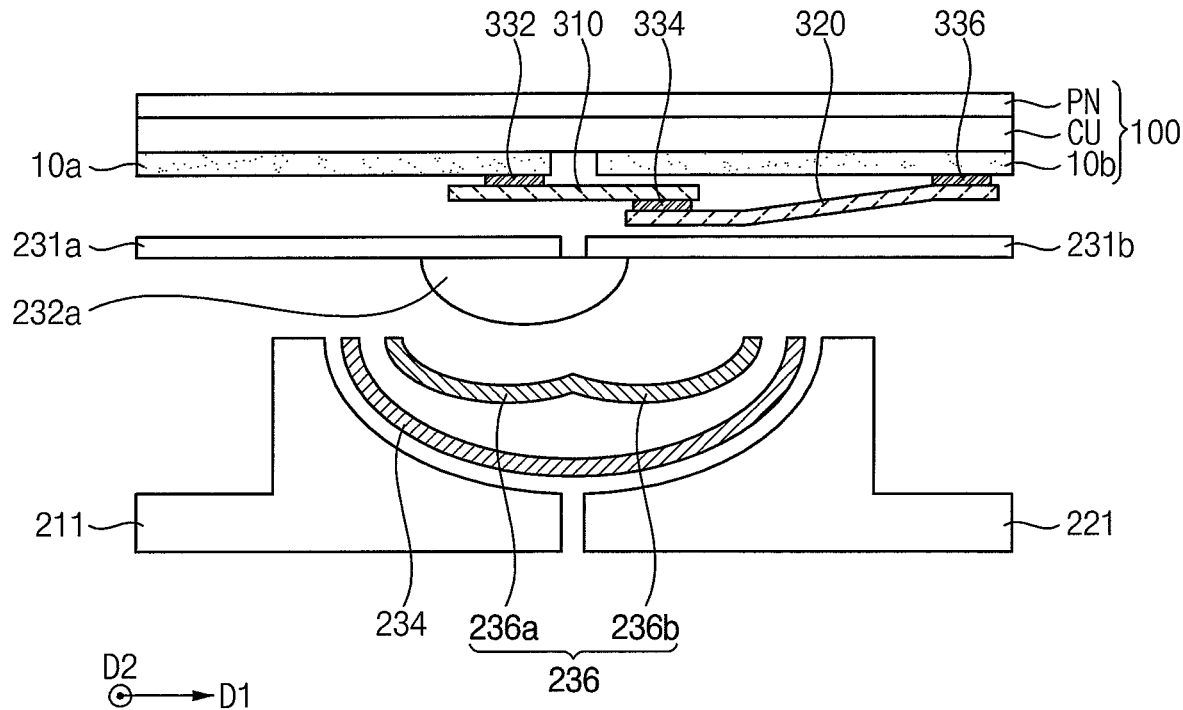
FIGS. 7 to 10 are schematic cross-sectional views illustrating a hinge area of a foldable display device according to embodiments.
Figure 8:
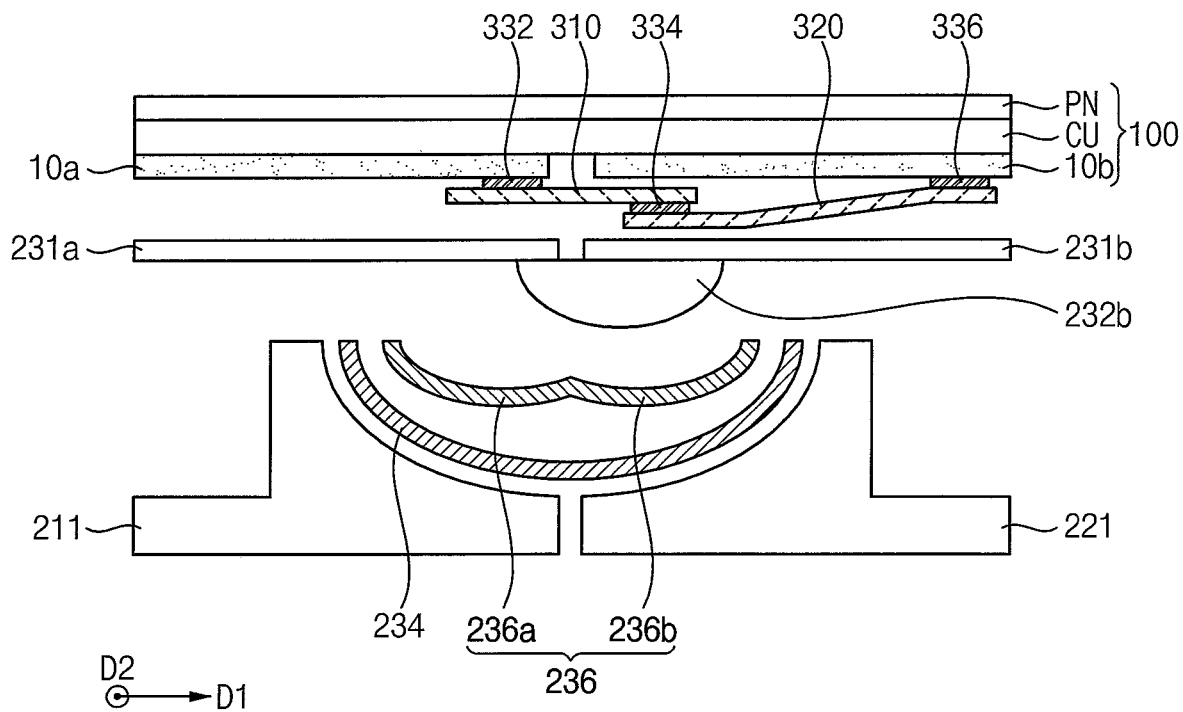
Figure 9:
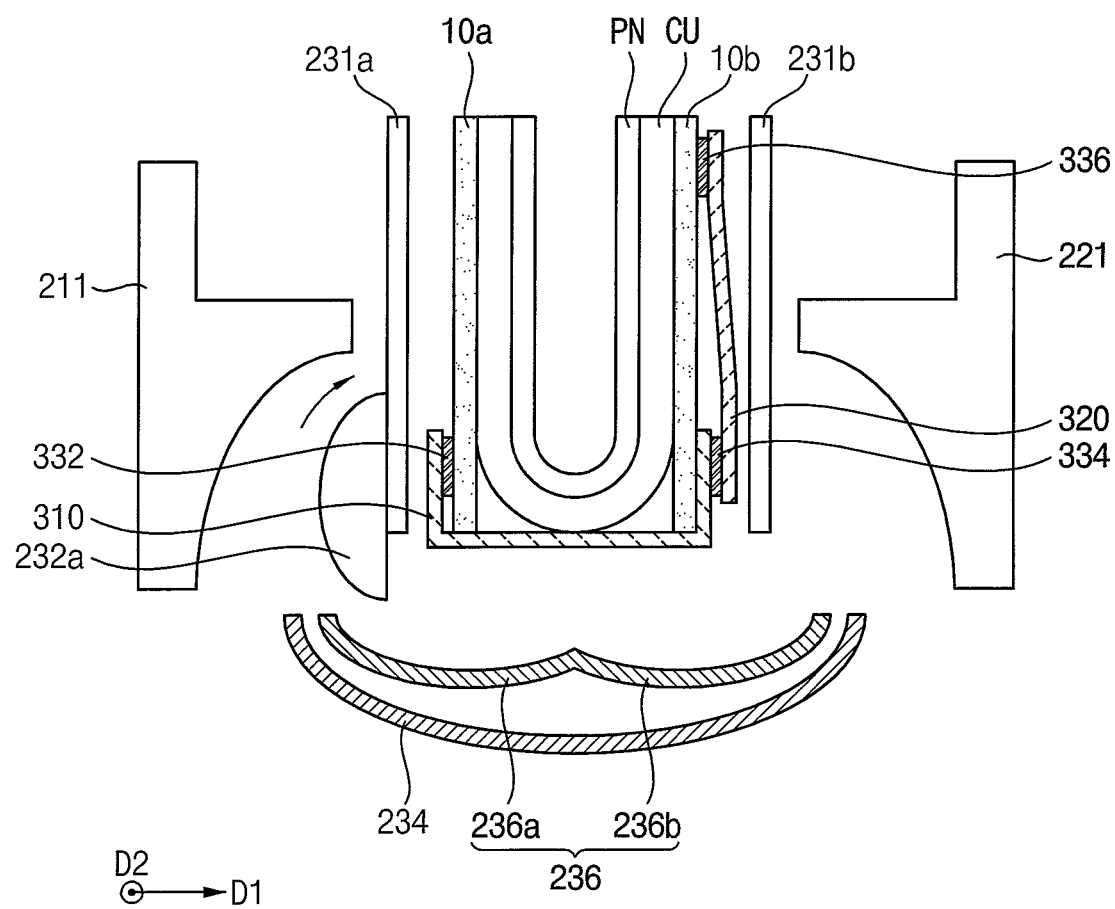
Figure 10:
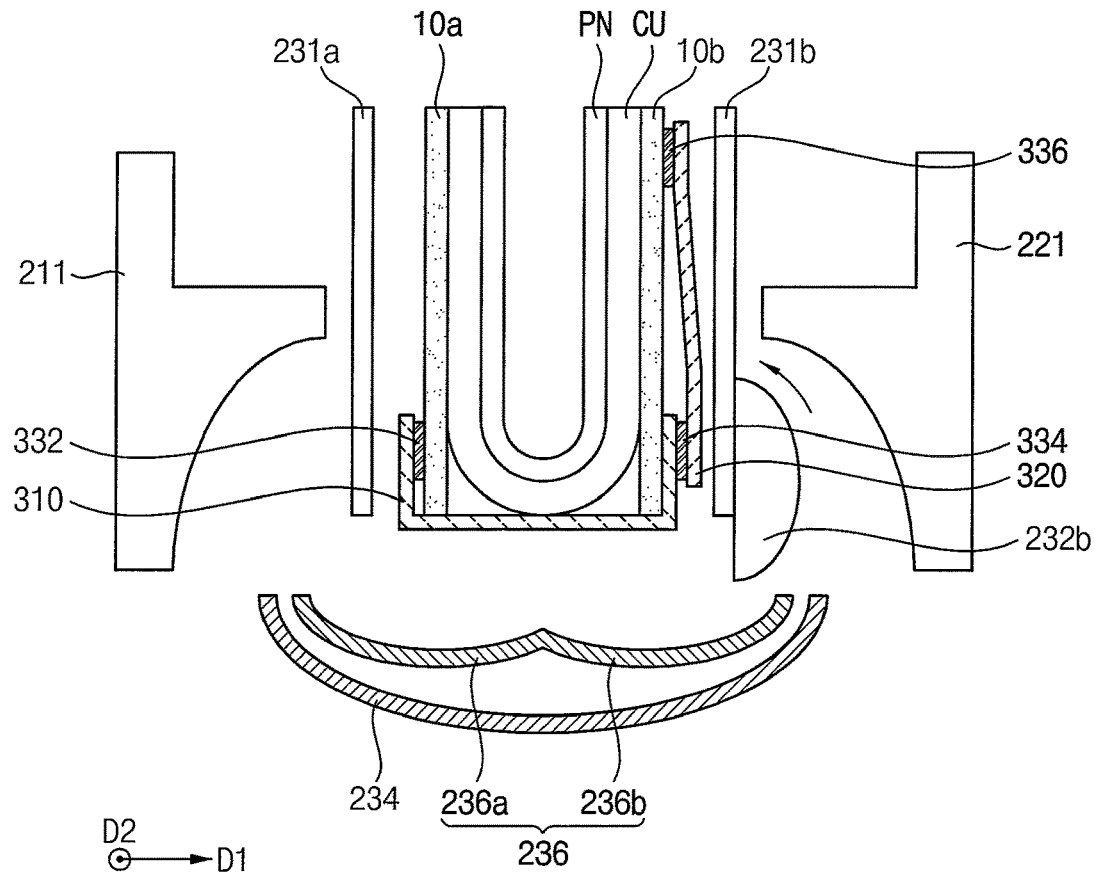
Figure 11:
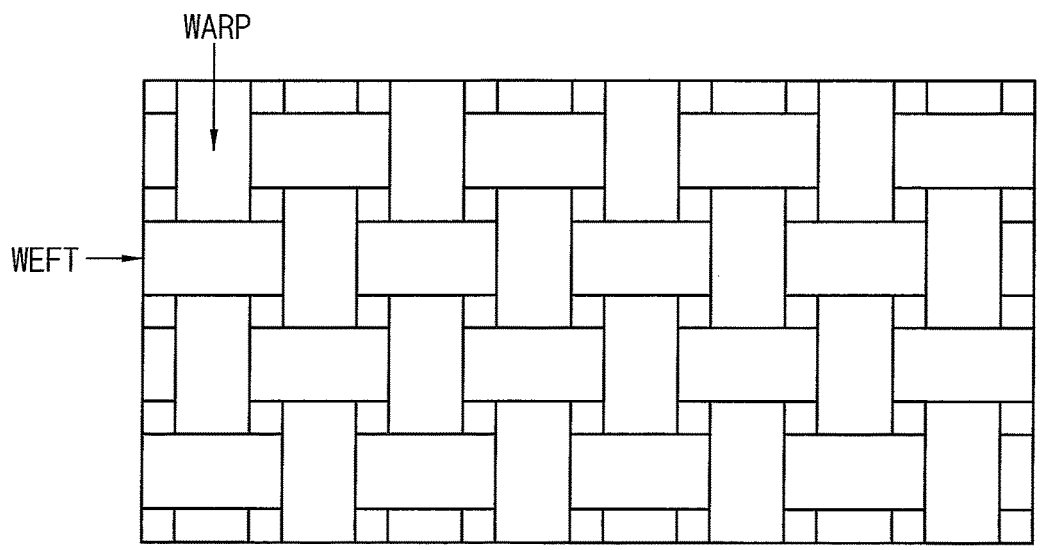
FIG. 11 is an enlarged schematic view illustrating a configuration of a shielding member of a foldable display device according to an embodiment.
Figure 12:
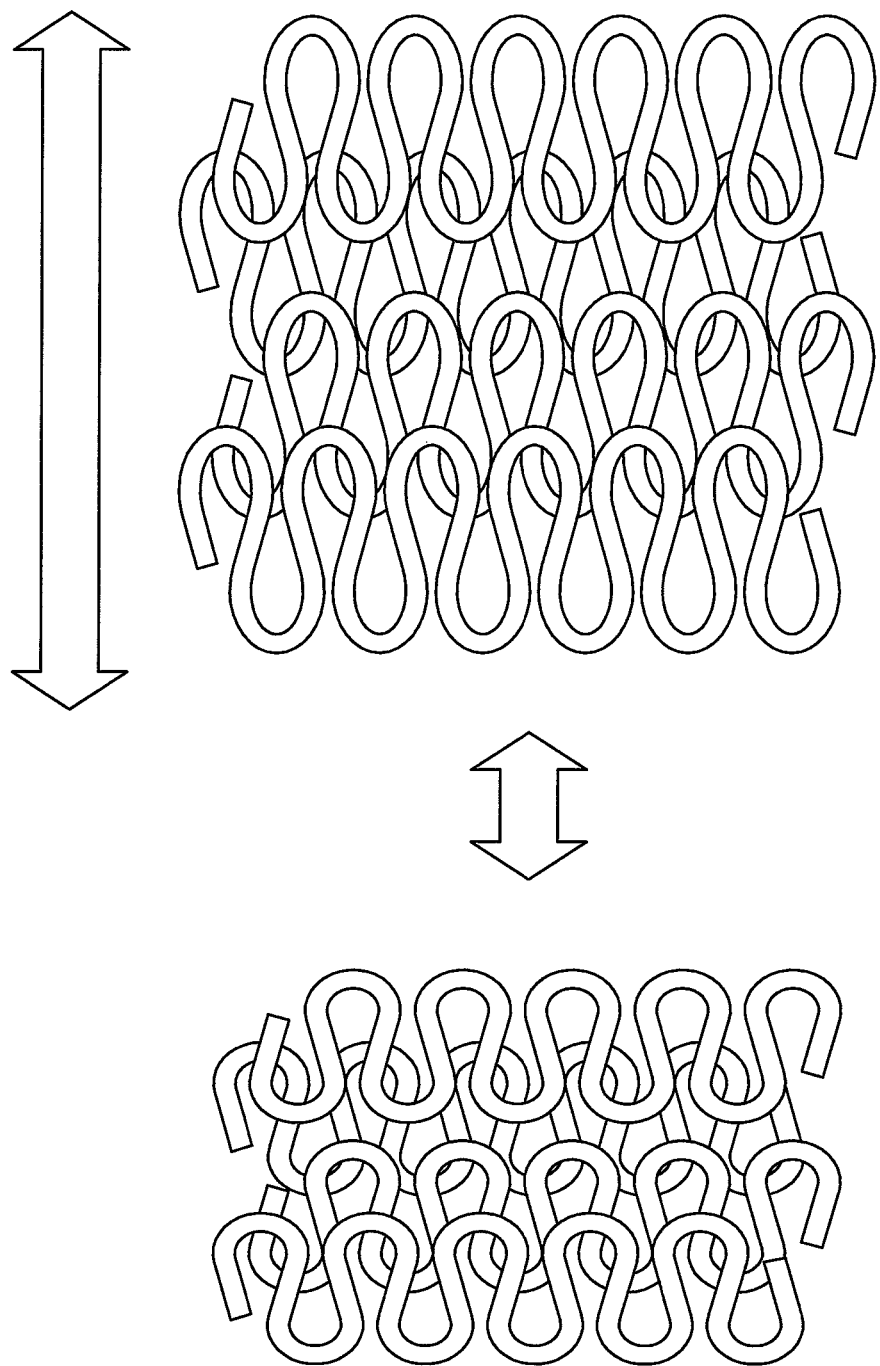
FIG. 12 is an enlarged schematic view illustrating a configuration and elongation of a stretchable member of a foldable display device according to an embodiment.

FIG. 6 is a schematic bottom view illustrating a display module according to an embodiment. FIGS. 7 to 10 are schematic cross-sectional views illustrating a hinge area of a foldable display device according to embodiments. FIGS. 7 and 9 may illustrate a cross-section taken along line II-II' of FIG. 6. FIGS. 8 and 10 may illustrate a cross-section taken along line III-III' of FIG. 6. FIG. 11 is an enlarged schematic view illustrating a configuration of a shielding member of a foldable display device according to an embodiment. FIG. 12 is an enlarged schematic view illustrating a configuration and elongation of a stretchable member of a foldable display device according to an embodiment.

Referring to FIGS. 6 to 8, a display device may include a display module 100 and a cover module. The cover module may include a hinge part, a first bottom cover 211 and a second bottom cover 221.

The display module 100 may be substantially the same as the display module previously explained with reference to FIGS. 3 to 5. For example, the display module 100 may include a panel part PN, an impact-absorbing member CU, a first supporting member 10a, a second supporting member 10b, a shielding member 310, which may cover a boundary area between the first supporting member 10a and the second supporting member 10b, and a stretchable member 320 combined with the second supporting member 10b and extended to the shielding member 310.

The hinge part may be combined with the display module 100. For example, the hinge part may be disposed on a lower surface of a folding area of the display module 100. Thus, the hinge part may overlap the boundary area between the first supporting member 10a and the second supporting member 10b. The first bottom cover 211 may cover a lower surface of the first supporting member 10a of the display module 100. The second bottom cover 221 may cover a lower surface of the second supporting member 10b of the display module 100.

In an embodiment, the hinge part may include a hinge frame 236, a first rotation-sliding member 232a, a second rotation-sliding member 232b, a first connection member 231a, a second connection member 231b and a hinge cover 234. In an embodiment, the rotation-sliding members 232a and 232b combined with the connection members 231a and 231b may slide on the hinge frame 236. Thus, the connection members 231a and 231b and the supporting members 10a and 10b connected thereto may be allowed to rotate.

The first connection member 231a may be combined with the first supporting member 10a of the display module 100. The second connection member 231b may be combined with the second supporting member 10b of the display module 100. Referring to FIGS. 7 and 8, a space may be defined between the first supporting member 10a and the first connection member 231a. However, embodiments are not limited thereto. For example, the first supporting member 10a and the first connection member 231a may partially or entirely contact each other. For example, the first connection member 231a may be disposed on an exposed lower surface of the first supporting member 10a not to face a lower surface of the shielding member 310.

When the second connection member 231b may be disposed under the stretchable member 320, a space may be defined between the second connection member 231b and the second supporting member 10b to allow elongation of the stretchable member 320 and sliding of the shielding member 310. For example, the second connection member 231b may be combined with an exposed lower surface of the second supporting member 10b and may be designed to form a receiving space through a suitable process so that the second connection member 231b may not contact the shielding member 310 and the stretchable member 320.

The first connection member 231a may be adjacent to the second connection member 231b in a first direction D1, and may rotate in different directions. For example, when the display device may be unfolded, the first connection member 231a may be spaced apart from the second connection member 231b in the first direction D1. However, embodiments are not limited thereto. For example, when the display device may be unfolded, the first connection member 231a may substantially contact the second connection member 231b.

The first and second connection members 231a and 231b may function as a bracket of the hinge part. For example, the first and second connection members 231a and 231b may be a metallic plate, respectively. However, embodiments are not limited thereto. For example, the first and second connection members 231a and 231b may include a polymer or the like.

In an embodiment, the hinge frame 236 may include a first guide portion 236a and a second guide portion 236b. The first and second guide portions 236a and 236b may have a guiding surface, which guides rotation of the first and second rotation-sliding members 232a and 232b, respectively. The guiding surface may have an arc shape having a curvature. The hinge frame 236 may have a shape extending in the second direction D2.

In an embodiment, the first and second guide portions 236a and 236b may be extended to each other so that the hinge frame 236 may have a cross-section of a dual-arc shape. However, embodiments are not limited thereto. For example, the first and second guide portions 236a and 236b may be separated from each other, or the hinge frame 236 may have a cross-section of a single arc shape.

The first rotation-sliding member 232a may be combined with the first connection member 231a, and may slide along the guiding surface of the first guide portion 236a. Thus, the first rotation-sliding member 232a and the first connection member 231a may rotate around a first rotation axis. In an embodiment, the first rotation-sliding member 232a may overlap a boundary area between the first connection member 231a and the second connection member 231b. Thus, the first rotation-sliding member 232a may overlap a portion of the second connection member 231b.

The second rotation-sliding member 232b may be combined with the second connection member 231b, and may slide along the guiding surface of the second guide portion 236b. Thus, the second rotation-sliding member 232b and the second connection member 231b may rotate around a second rotation axis. In an embodiment, the second rotation-sliding member 232b may overlap a boundary area between the first connection member 231a and the second connection member 231b. Thus, the second rotation-sliding member 232b may overlap a portion of the first connection member 231a.

Referring to FIG. 6, the number of the rotation-sliding members may be four. However, embodiments are not limited thereto, and a display device according to embodiments may have suitable rotation-sliding members.

The hinge cover 234 may cover the hinge frame 236. For example, the hinge cover 234 may have a shape extending in the second direction D2. For example, the hinge cover 234 may have a cross-section having an arc shape.

The first and second bottom covers 211 and 221 may respectively rotate around the hinge part. For example, the first and second bottom covers 211 and 221 may rotate along an outer cylindrical surface of the hinge cover 234 around a rotation axis.

Even though not illustrated, the hinge part may further include a cam structure for synchronizing movement of the rotation-sliding members, a hinge housing for fixing the hinge frame 236, or the like.

FIGS. 9 and 10 illustrate a folded display device. Referring to FIG. 9, a first rotation-sliding member 232a includes a sliding surface having an arc shape. When the display device may be unfolded, the sliding surface of the first rotation-sliding member 232a faces the guiding surface of the first guide portion 236a of the hinge frame 236. When a force may be applied to the display device to fold the display device, the first rotation-sliding member 232a may slide along the guiding surface of the first guide portion 236a to rotate around the first axis. Thus, the first rotation-sliding member 232a, the first connection member 231a combined with the first rotation-sliding member 232a and the first bottom cover 211 disposed under the first connection member 231a may rotate around the first rotation axis.

Referring to FIG. 10, when a force may be applied to the display device to fold the display device, the second rotation-sliding member 232b may slide along the guiding surface of the second guide portion 236b to rotate around the second axis. Thus, the second rotation-sliding member 232b, the second connection member 231b combined with the second rotation-sliding member 232b and the second bottom cover 221 disposed under the second connection member 231b may rotate around the second rotation axis.

In an embodiment, the display module may be combined with the first connection member 231a and the second connection member 231b. Thus, the display module may be folded or unfolded depending on operation of the hinge part.

When the display module may be folded or bent, a distance between the supporting member 10a and the second supporting member 10b may be increased. In an embodiment, since the shielding member 310 may be combined with the second supporting member 10b through the stretchable member 320, position of the shielding member 310 may not be fixed to the second supporting member 10b. Thus, the shielding member 310 may slide on the second supporting member 10b.

If the shielding member 310 may be fixed to both of the first supporting member 10a and the second supporting member 10b, the shielding member 310 may be damaged by forced strain because the shielding member 310 has a relatively small elongation. If the shielding member 310 includes a stretchable material to increase an elongation, the shielding member 310 may be easily damaged by abrasion or may be irreversibly deformed.

In an embodiment, the shielding member 310 may include a material having a relatively great abrasion resistance. Thus, damage due to abrasion may be prevented. Furthermore, the shielding member 310 may be extended to the stretchable member 320, which may be elongated when the display module 100 may be transformed. Thus, damage or irreversible deformation of the shielding member 310 due to forced strain may be prevented.

When the stretchable member 320 may be elongated, a tensile force may be applied to the shielding member 310. Thus, the shielding member 310 may get close to the first and second supporting members 10a and 10b thereby effectively blocking impurities.

In an embodiment, the shielding member 310 may include a woven fabric including a warp and a weft, as illustrated in FIG. 11. However, configuration of the shielding member 310 is not limited thereto. For example, the shielding member 310 may have a fabric configuration, which has a greater abrasion resistance, such as twill or the like.

In an embodiment, the stretchable member 320 may include a knit fabric. The knit fabric may be easily elongated in a direction of a tensile force and may be easily restored when the tensile force may be removed, as illustrated in FIG. 12.

Figure 13:
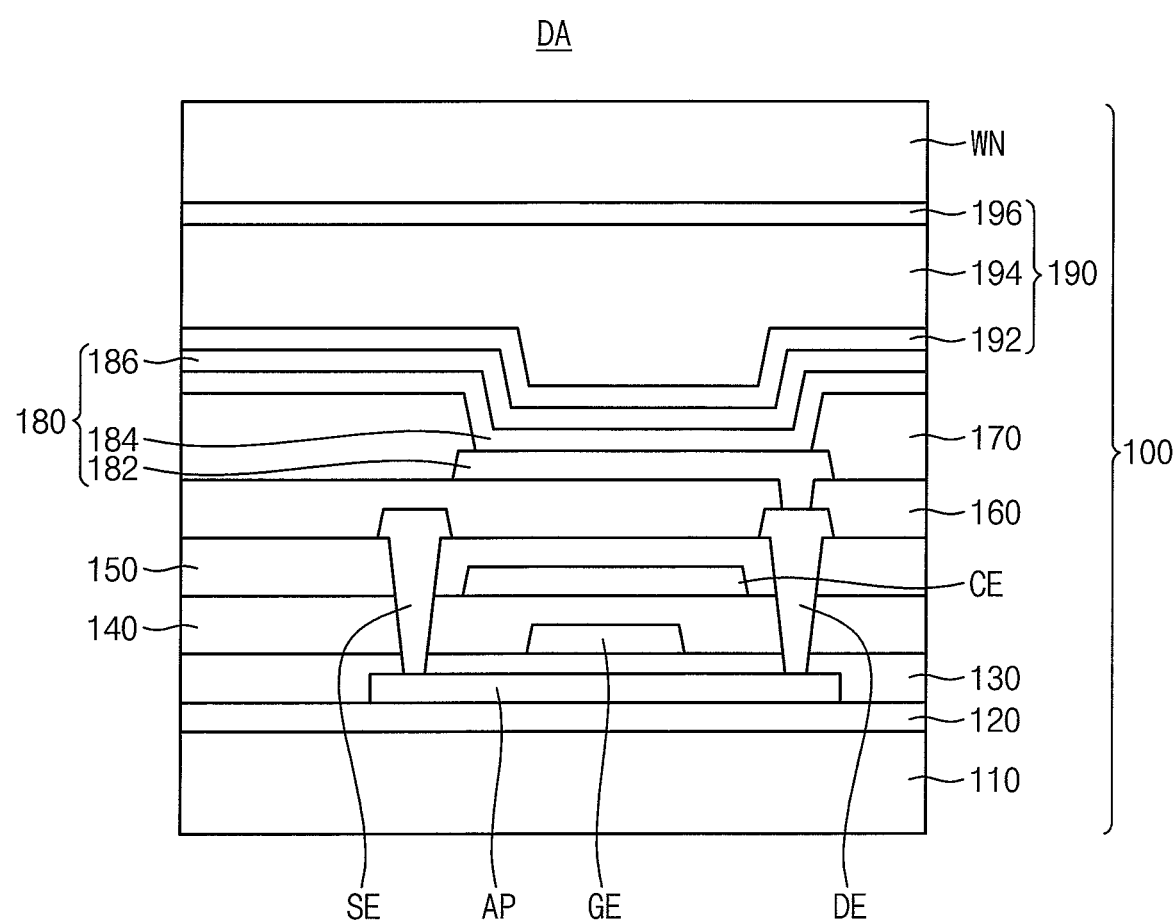
FIG. 13 is a schematic cross-sectional view illustrating a panel part of a foldable display device according to an embodiment.

FIG. 13 is a schematic cross-sectional view illustrating a panel part of a foldable display device according to an embodiment.

Referring to FIG. 13, a pixel of a panel part PN may include a driving element disposed on a base substrate 110 and a light-emitting element electrically connected to the driving element. In an embodiment, the light-emitting element may be an organic light-emitting diode. The driving element may include at least one thin film transistor.

A buffer layer 120 may be disposed on the base substrate 110. An active pattern AP may be disposed on the buffer layer 120.

For example, the base substrate 110 may include glass, quartz, sapphire, a polymeric material, or the like or a combination thereof. In an embodiment, the base substrate 110 may be a flexible substrate including a polymeric material. For example, the base substrate 110 may include polyethylenenaphthalate, polyethyleneterephthalate, polyetherketone, polycarbonate, polyarylate, polyethersulphone, polyimide or a combination thereof.

The panel part PN may further include a supporting substrate disposed under the base substrate 110.

The buffer layer 120 may prevent or reduce permeation of impurities, humidity or external gas from underneath of the base substrate 110, and may planarize an upper surface of the base substrate 110. For example, the buffer layer 120 may include an inorganic material such as oxide, nitride, or the like or a combination thereof.

A first gate metal pattern including a gate electrode GE may be disposed on the active pattern AP. A first insulation layer 130 may be disposed between the active pattern AP and the gate electrode GE.

A second gate metal pattern including a capacitor electrode pattern CE may be disposed on the gate electrode GE. The capacitor electrode pattern CE may include a capacitor electrode for forming a capacitor, a wiring for transferring various signals or the like.

A second insulation layer 140 may be disposed between the gate electrode GE and the capacitor electrode pattern CE. A third insulation layer 150 may be disposed on the capacitor electrode pattern CE.

For example, the active pattern AP may include silicon, a metal oxide semiconductor or a combination thereof. In an embodiment, the active pattern AP may include polycrystalline silicon (polysilicon), which may be doped with n-type impurities or p-type impurities.

In another embodiment or in another transistor that is not illustrated, an active pattern may include a metal oxide semiconductor. For example, the active pattern may include two-component compound (ABx), ternary compound (ABxCy) or four-component compound (ABxCyDz), which includes indium (In), zinc (Zn), gallium (Ga), tin (Sn), titanium (Ti), aluminum (Al), hafnium (Hf), zirconium (Zr), magnesium (Mg) or a combination thereof. For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like or a combination thereof.

The first insulation layer 130, the second insulation layer 140 and the third insulation layer 150 may include silicon oxide, silicon nitride, silicon carbide or a combination thereof. Furthermore, the first insulation layer 130, the second insulation layer 140 and the third insulation layer 150 may include an insulating metal oxide such as aluminum oxide, tantalum oxide, hafnium oxide, zirconium oxide, titanium oxide, or the like or a combination thereof. For example, the first insulation layer 130, the second insulation layer 140 and the third insulation layer 150 may have a single-layered structure or a multi-layered structure including silicon nitride and/or silicon oxide, respectively, or may have different structures from each other.

The gate electrode GE and the capacitor electrode pattern CE may include a metal, a metal alloy, a metal nitride, a conductive metal oxide, or the like or a combination thereof. For example, the gate electrode GE and the capacitor electrode pattern CE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 150. The first source metal pattern may include a source electrode SE and a drain electrode DE, which electrically contact the active pattern AP. The source electrode SE and the drain electrode DE may pass through the insulation layers disposed thereunder to contact the active pattern AP, respectively.

The first source metal pattern may include a metal, a metal alloy, a metal nitride, a conductive metal oxide, or the like or a combination thereof. For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers. In an embodiment, the first source metal pattern may have a multi-layered structure including an aluminum layer.

A fourth insulation layer 160 may be disposed on the first source metal pattern. The fourth insulation layer 160 may include an organic material. For example, the fourth insulation layer 160 may include an organic insulation material such as a phenol resin, an acryl resin, a polyimide resin, a polyamide resin, a siloxane resin, an epoxy resin, or the like or a combination thereof.

An organic light-emitting diode 180 may be disposed on the fourth insulation layer 160. The organic light-emitting diode 180 may include a first electrode 182 electrically contacting the drain electrode DE, an organic light-emitting layer 184 disposed on the first electrode 182 and a second electrode 186 disposed on the organic light-emitting layer 184. The organic light-emitting layer 184 of the organic light-emitting diode 180 may be disposed at least in an opening of a pixel-defining layer 170 disposed on the fourth insulation layer 160. The first electrode 182 may be a lower electrode of the organic light-emitting diode 180, and the second electrode 186 may be an upper electrode of the organic light-emitting diode 180.

The first electrode 182 may function as an anode. For example, the first electrode 182 may be formed as a transmitting electrode or a reflecting electrode according to an emission type of the display device. When the first electrode 182 may be a transmitting electrode, the first electrode 182 may include indium tin oxide, indium zinc oxide, zinc tin oxide, indium oxide, zinc oxide, tin oxide, or the like or a combination thereof. When the first electrode 182 may be a reflecting electrode, the first electrode 182 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

The pixel-defining layer 170 has the opening overlapping at least a portion of the first electrode 182. For example, the pixel-defining layer 170 may include an organic insulating material.

The organic light-emitting layer 184 may include at least a light-emitting layer, and may further include at least one of a hole injection layer (HIL), a hole transporting layer (HTL), an electron transporting layer (ETL) and an electron injection layer (EIL). For example, the organic light-emitting layer 184 may include a low molecular weight organic compound or a high molecular weight organic compound.

In an embodiment, the organic light-emitting layer 184 may emit a red light, a green light or a blue light. In another embodiment, the organic light-emitting layer 184 may emit a white light. The organic light-emitting layer 184 emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode 186 may be formed as a transmitting electrode or a reflecting electrode according to an emission type of the display device. For example, the second electrode 186 may include a metal, a metal alloy, a metal nitride, a metal fluoride, a conductive metal oxide or a combination thereof.

For example, the second electrode 186 and at least one layer of the organic light-emitting layer 184 may be formed as a common layer extending continuously over multiple pixels in a display area.

An encapsulation layer 190 may be disposed on the organic light-emitting diode 180. The encapsulation layer 190 may have a stacked structure of an inorganic thin film and an organic thin film. For example, the encapsulation layer 190 may include a first inorganic thin film 192, an organic thin film 194 disposed on the first inorganic thin film 192 and a second inorganic thin film 196 disposed on the organic thin film 194.

A protective window WN may be disposed on the encapsulation layer 190. For example, the protective window WN may include a polymeric material, a glass thin film to have a flexibility or a combination thereof.

As desired, at least one of a touch-sensing structure and a polarizing layer may be disposed between the encapsulation layer 190 and the protective window WN.

A supporting substrate may be disposed under the base substrate 110. The supporting substrate may have an opening to reduce a bending stress in a bending area.

Figure 14:
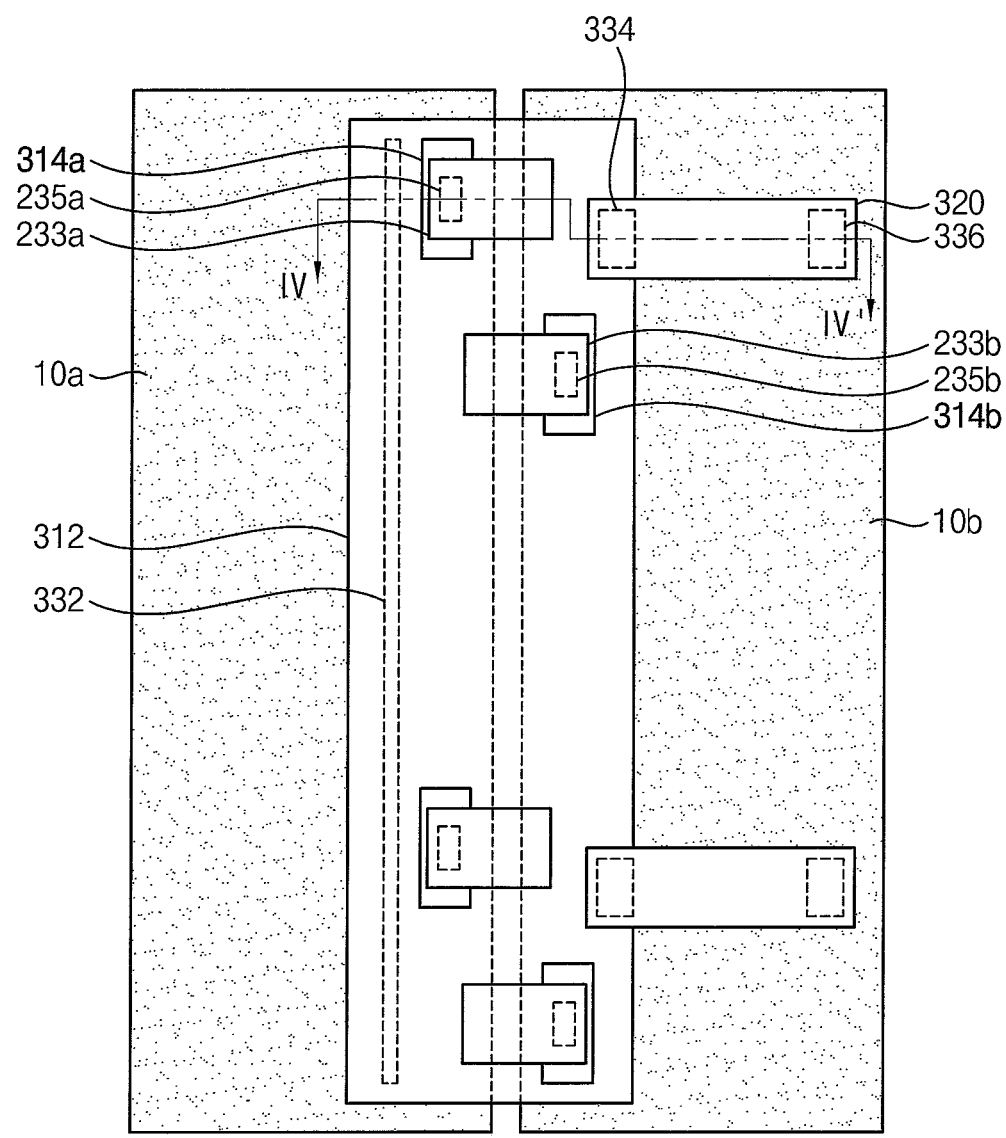
FIG. 14 is a schematic bottom view illustrating a foldable display device according to an embodiment.
Figure 15:
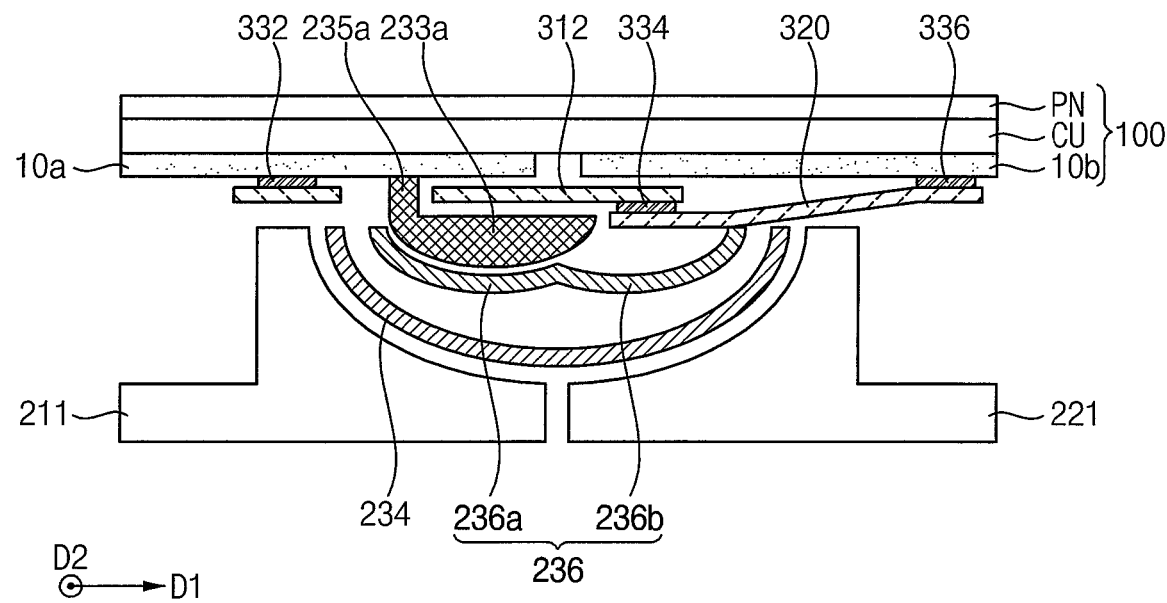
FIG. 15 is a schematic cross-sectional view taken along line IV-IV of FIG. 14.

FIG. 14 is a schematic bottom view illustrating a foldable display device according to an embodiment. FIG. 15 is a schematic cross-sectional view taken along line IV-IV of FIG. 14. FIG. 14 may illustrate a display device, from which a bottom cover, a hinge cover and a hinge frame are removed, and FIG. 15 may illustrate a display device including a bottom cover, a hinge cover and a hinge frame.

Referring to FIGS. 14 and 15, a display device may include a display module 100 and a cover module. The cover module may include a hinge part, a first bottom cover 211 and a second bottom cover 221.

For example, the display module 100 may include a panel part PN, an impact-absorbing member CU, a first supporting member 10*a*, a second supporting member 10*b*, a shielding member 312, which covers a boundary area between the first supporting member 10*a* and the second supporting member 10*b*, and a stretchable member 320 combined with the second supporting member 10*b* and extended to the shielding member 312.

For example, the hinge part may be disposed on a lower surface of a folding area of the display module 100. Thus, the hinge part may overlap the boundary area between the first supporting member 10*a* and the second supporting member 10*b*. The first bottom cover 211 may cover a lower surface of the first supporting member 10*a* of the display module 100. The second bottom cover 221 may cover a lower surface of the second supporting member 10*b* of the display module 100.

In an embodiment, the hinge part may include a hinge frame 236, a first rotation-sliding member 233*a*, a second rotation-sliding member 233*b* and a hinge cover 234.

In an embodiment, the shielding member 312 includes an opening, through which rotation-sliding members of a hinge part may be combined with the supporting members.

For example, the shielding member 312 includes a first opening 314*a* overlapping the first supporting member 10*a* and a second opening 314*b* overlapping the second supporting member 10*b*. A fixing portion 235*a* of the first rotation-sliding member 233*a* may pass through the first opening 314*a* to be extended to a lower surface of the first supporting member 10*a*. A fixing portion 235*b* of the second rotation-sliding member 233*b* may pass through the second opening 314*b* to be extended to a lower surface of the second supporting member 10*b*. The first rotation-sliding member 233*a* and the second rotation-sliding member 233*b* may extend from the fixing portions in a lateral direction to face a lower surface of the shielding member 312, respectively.

A first end of the shielding member 312 may be fixed to a lower surface of the first supporting member 10*a* by a first adhesive member 332. A second end of the shielding member 312 may be fixed to a first end of the stretchable member 320 by a second adhesive member 334. A second end of the stretchable member 320 may be fixed to a lower surface of the second supporting member 10*b* by a third adhesive member 336.

In an embodiment, the hinge part may be combined with the supporting members 10*a* and 10*b* without additional connection members. Such a configuration may reduce a thickness of a display device.

Figure 16:
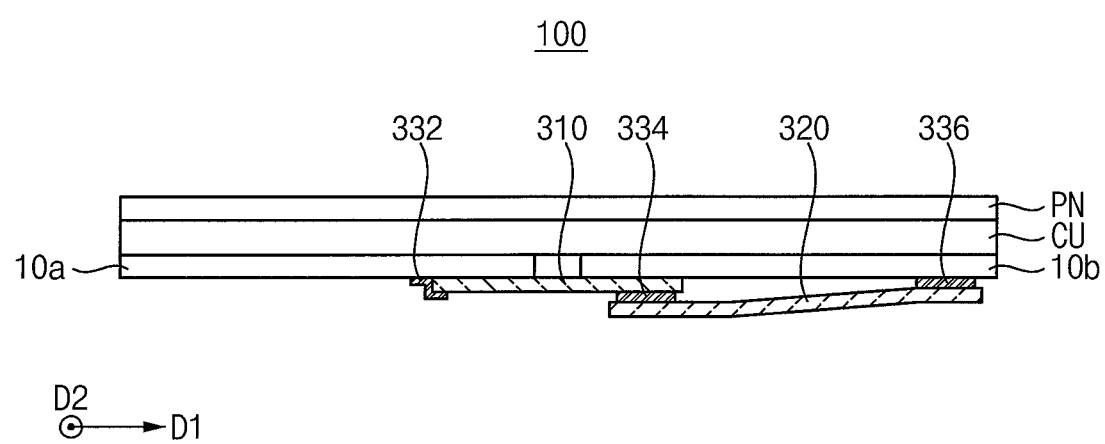
FIGS. 16 and 17 are schematic cross-sectional views illustrating a display module according to embodiments.
Figure 17:
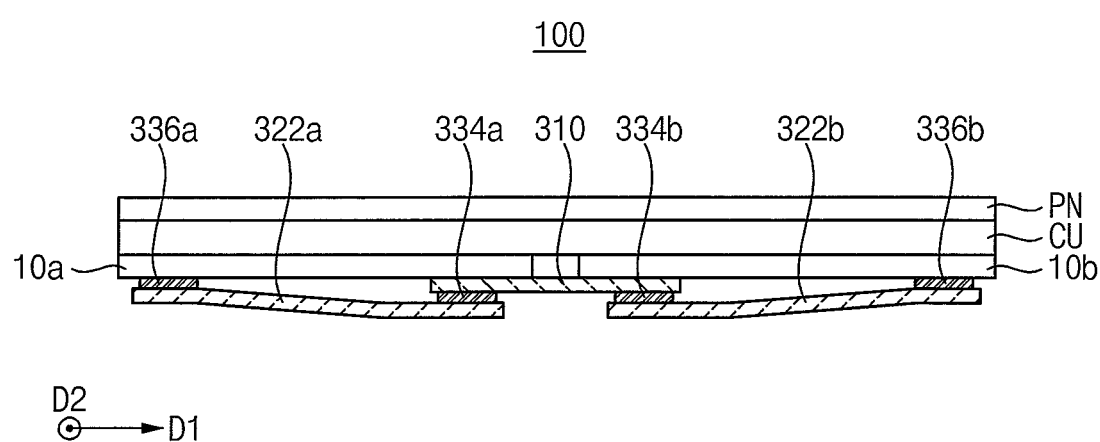

FIGS. 16 and 17 are schematic cross-sectional views illustrating a display module according to embodiments.

Referring to FIG. 16, a first adhesive member 332 fixing a first end of a shielding member 310 to a first supporting member 10*a* may be a single-side tape having an adhesive layer on one surface thereof. For example, the first adhesive member 332 may partially adhere to a lower surface of the first supporting member 10*a*, and may partially adhere to a lower surface of the shielding member 310. An adhesive member having a substantially same configuration may be used for a second adhesive member 334, which combines the shielding member 310 with a stretchable member 320, or a third adhesive member 336, which combines the stretchable member 320 with a second supporting member 10*b*.

Referring to FIG. 17, stretchable members 322*a* and 322*b* may be extended to both ends of a shielding member 310.

For example, a first stretchable member 322*a* may be extended to a first end of the shielding member 310, and a second stretchable member 322*b* may be extended to a second end of the shielding member 310. The first stretchable member 322*a* may be combined with a first supporting member 10*a*, and the second stretchable member 322*b* may be combined with a second supporting member 10*b*. Second adhesive members 334*a*, 334*b* and third adhesive members 336*a*, 336*b* may have a substantially same configuration as described above.

The above embodiments provide an organic-light emitting display device. However, embodiments are not limited thereto. For example, embodiments may be applied for a hinge structure of display devices such as a liquid crystal display device, a electroluminescent display device, a micro LED display device or the like.

Embodiments may be applied to various display devices. In an embodiment, for example, embodiments may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the inventive concept. Accordingly, all such modifications are intended to be included within the scope of the inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the inventive concept, as set forth in the following claims and equivalents thereof.

What is claimed is:

1. A display module comprising:
   a panel part including a pixel array to display an image;
   a first supporting member disposed under the panel part;
   a second supporting member disposed under the panel part and adjacent to the first supporting member in a first direction;
   a shielding member covering a boundary area between the first supporting member and the second supporting member; and
   a stretchable member extended to the shielding member and disposed under the first supporting member or the second supporting member, wherein an elongation of the stretchable member is greater than an elongation of the shielding member.

2. The display module of claim 1, further comprising a hinge part extended to the first supporting member and the second supporting member, wherein the first supporting member and the second supporting member rotate with respect to a rotation axis of the hinge part.

3. The display module of claim 1, wherein the shielding member includes a fabric material including at least one of a woven fabric and a non-woven fabric.

4. The display module of claim 1, wherein the shielding member includes a polymeric film.

5. The display module of claim 1, wherein the stretchable member includes a knit fabric.

6. The display module of claim 1, wherein the stretchable member includes a material including at least one of polyurethane, synthetic rubber, and natural rubber.

7. The display module of claim 1, wherein the elongation of the stretchable member is at least about 10%.

8. The display module of claim 1, wherein
   a first end of the shielding member is combined with the first supporting member,
   a second end of the shielding member is combined with a first end of the stretchable member, and
   a second end of the stretchable member is combined with the second supporting member.

9. The display module of claim 1, wherein
   the stretchable member includes:
      a first stretchable member combined with the first supporting member; and
      a second stretchable member combined with the second supporting member,
      a first end of the shielding member is extended to the first stretchable member, and
      a second end of the shielding member is extended to the second stretchable member.

10. The display module of claim 1, wherein the stretchable member is extended to the shielding member in serial with respect to a tensile force generated by rotation of the first supporting member or the second supporting member.

11. The display module of claim 10, wherein a width of the stretchable member in a direction perpendicular to the tensile force is smaller than a width of the shielding member.

12. The display module of claim 1, further comprising an impact-absorbing member disposed between the panel part and the first and second supporting members.

13. The display module of claim 1, wherein the panel part includes an organic light-emitting display panel.

14. A foldable display device comprising:
   a panel part including a pixel array to display an image;
   a first supporting member disposed under the panel part;
   a second supporting member disposed under the panel part and adjacent to the first supporting member in a first direction;
   a shielding member covering a boundary area between the first supporting member and the second supporting member;
   a stretchable member extended to the shielding member and disposed under the first supporting member or the second supporting member, wherein an elongation of the stretchable member is greater than an elongation of the shielding member; and
   a hinge part disposed under the shielding member.

15. The foldable display device of claim 14, wherein the hinge part includes:
   a first connection member combined with the first supporting member;
   a second connection member combined with the second supporting member;
   a first rotation-sliding member combined with the first connection member and including a sliding surface having an arc shape;
   a second rotation-sliding member combined with the second connection member and including a sliding surface having an arc shape;
   a hinge frame including a guiding surface facing the sliding surfaces of the first and second rotation-sliding members; and
   a hinge cover covering the hinge frame.

16. The foldable display device of claim 15, wherein a portion of the stretchable member is disposed between the second supporting member and the second connection member.

17. The foldable display device of claim 14, wherein the shielding member includes an opening through which the hinge part is extended to the first and second supporting members.

18. The foldable display device of claim 14, wherein the shielding member includes a material including at least one of a woven fabric, a non-woven fabric, and a polymeric film.

19. The foldable display device of claim 14, wherein the stretchable member includes a material including at least one of a knit fabric, polyurethane, synthetic rubber, and natural rubber.

20. The foldable display device of claim 14, wherein
   an end of the shielding member is combined with the first connection member, and
   an end of the stretchable member is combined with the second connection member.

21. The foldable display device of claim 14, wherein the panel part includes an organic light-emitting display panel.

* * * * *